United States Patent
Fernihough et al.

(10) Patent No.: US 7,192,622 B2
(45) Date of Patent: *Mar. 20, 2007

(54) PROCESS OF MASKING COOLING HOLES OF A GAS TURBINE COMPONENT

(75) Inventors: John Fernihough, Ennetbaden (CH); Andreas Boegli, Vogelsang-Turgi (CH); Alexander Stankowski, Neuenhof (CH)

(73) Assignee: Alstom Technology Ltd, Baden (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/995,489

(22) Filed: Nov. 24, 2004

(65) Prior Publication Data

US 2005/0215686 A1 Sep. 29, 2005

Related U.S. Application Data

(60) Provisional application No. PCT/CH03/00324, filed on May 20, 2003.

(30) Foreign Application Priority Data

May 24, 2002 (EP) ................... 02405416

(51) Int. Cl.
*B05D 1/32* (2006.01)
*B05D 3/06* (2006.01)
*B05D 7/22* (2006.01)

(52) U.S. Cl. ............ 427/157; 427/553; 427/558; 427/595; 427/230; 427/235; 427/239; 427/259; 427/264; 427/265; 427/272; 427/282; 427/287

(58) Field of Classification Search ............ 427/157, 427/282, 230, 235, 239, 595, 259, 261, 264, 427/265, 272, 287, 510, 553, 558
See application file for complete search history.

(56) References Cited

U.S. PATENT DOCUMENTS

| | | | |
|---|---|---|---|
| 4,743,462 A | 5/1988 | Radzavich et al. | |
| 5,216,808 A | 6/1993 | Martus et al. | |
| 5,540,880 A | * 7/1996 | Horiki et al. | ............ 264/553 |
| 5,565,035 A | 10/1996 | Sylvestro et al. | |
| 5,702,288 A | 12/1997 | Liebke et al. | |

(Continued)

FOREIGN PATENT DOCUMENTS

EP 0 851 098 A2 7/1998

(Continued)

*Primary Examiner*—Kirsten Jolley
(74) *Attorney, Agent, or Firm*—Buchanan Ingersoll & Rooney PC

(57) ABSTRACT

Process of masking cooling holes of a gas turbine component with an external surface, comprising a cavity and a plurality of cooling holes before coating the gas turbine component, comprising the steps of first applying a mask material to the cooling holes so that the cooling holes are filled at least closest to the external surface, whereby the mask material contains a substance which fluoresces under ultraviolet light and a filler material. Then the mask material within the cooling holes is thickening. An inspection using ultraviolet light to locate any unwanted residual mask material on the external surface is carried out and unwanted residual mask material is removed before the coating is applied to the external surface of the component and the masked cooling holes. In the end the mask material is removed from the cooling holes.

24 Claims, 5 Drawing Sheets

U.S. PATENT DOCUMENTS

| | | |
|---|---|---|
| 5,800,695 A | 9/1998 | Kang et al. |
| 5,902,647 A | 5/1999 | Venkataramani et al. |
| 5,985,122 A | 11/1999 | Conner |
| 6,004,620 A | 12/1999 | Camm |
| 6,210,488 B1 | 4/2001 | Bruce |
| 6,258,226 B1 | 7/2001 | Conner |
| 6,265,022 B1 | 7/2001 | Fernihough et al. |
| 2001/0001680 A1 | 5/2001 | Farmer et al. |
| 2001/0006707 A1 | 7/2001 | Farmer et al. |
| 2004/0191460 A1* | 9/2004 | Hoelger .................. 428/43 |

FOREIGN PATENT DOCUMENTS

| | | |
|---|---|---|
| EP | 0 854 005 A2 | 7/1998 |
| EP | 1 076 106 A1 | 2/2001 |

* cited by examiner

PROCESS OF MASKING COOLING HOLES OF A GAS TURBINE COMPONENT

The present application claims priority under 35 U.S.C. § 120 as a continuation of PCT/CH03/00324 filed May 20, 2003 and claims priority under 35 U.S.C. § 119 to European Application No. 02405416.5 filed May 24, 2002, the contents of both applications being hereby incorporated by reference in their entireties.

FIELD OF THE INVENTION

The invention relates to a process of masking cooling holes of a gas turbine component.

BACKGROUND OF THE INVENTION

Components such as gas turbine blades, vanes and other cooled parts often contain cavities that distribute cooling air to a plurality of holes in the wall of the part that lead to the outer surface. Most turbine components are coated for protection from oxidation and/or corrosion with, for example, a MCrAlY coating (base coat) and some are also coated with a thermal barrier coating (TBC) for thermal insulation. The demands of operation of the parts in a gas turbine often lead to the degradation of the coating before the structural integrity of the underlying part itself is degraded. Hence, the base coat and TBC must be removed and re-applied at least once during the lifetime of the component.

The re-application of the coatings can be very problematic for parts with a large number of cooling holes. Often the base coat can reach thicknesses of 150–300 µm, and the TBC may be another 200–500 µm in thickness. During original part manufacture, the coatings are usually first and then the holes are drilled directly through the coatings and the wall thickness of the component.

However, during the repair operations the holes are already in place, including during re-coating. The combined thicknesses of these coatings would have a very significant (and negative) influence on the effectiveness of the cooling holes if the coatings were deposited into these holes during re-coating, especially considering that some holes are 1 mm or less in diameter. Specially shaped cooling holes are particularly susceptible to this as their effectiveness depends heavily on the accuracy of the shape of the hole. This problem is particularly great for the most modern components which contain hundreds of cooling holes and are designed to operate within very tight tolerance bandwidths—the upper limit on cooling hole diameter to stop the waste of unneeded cooling air (which drastically reduces engine efficiency and power output) and the lower limit on cooling diameter to prevent overheating of the component, which would lead to its failure in service. In fact, the filling of cooling holes can become so extreme that they are completely blocked, and it is even difficult to visually locate the cooling holes at all.

There have been several disclosures relating to this problem and there are several widely known practices. Those skilled in the art are aware that a common practice is to braze or weld the holes closed with a suitable material after the old coatings have been removed, re-apply the new coatings, and re-manufacture the holes. The problem with this is that the brazing or welding operations introduce zones of weakness into the material. Normal hole manufacturing operations have errors associated with the placement of the holes, and when residual welding or brazing material is left, the zones of weakness go into operation with the part and compromise the mechanical integrity of the part.

One disclosure which offers a solution to this is U.S. Pat. No. 5,702,288, in which an abrasive slurry is injected into the cavity of the component and forced through the cooling holes which were partially covered by the coating material. There was no welding or brazing closed prior to coating. However this also abrades the internal cooling configuration (ribs), any inserts, and also the non-coated portion of the cooing holes. In addition, it would not be possible to use this process on a stator vane which contained a cooling air distribution insert, without first removing the insert. This would be time consuming and very expensive. Another version of this technique is disclosed in U.S. Pat. No. 5,702,288. In these cases the abrasive slurry is injected from the outside of the component to the inside, through the cooling holes. However, the drawbacks of this method are similar, and there is an added problem of contamination of the coating with the slurry mixture. U.S. Pat. No. 5,702,288 also discloses the use of a masking agent for selectively choosing which cooling holes will be affected by the abrasive slurry. A further disadvantage of this method is that it would be nearly impossible to successfully use on shaped cooling holes, particularly on the continuously widening exterior portion due to the relatively very slow flow of slurry in that area.

Another disclosure which offers a better solution is U.S. Pat. No. 4,743,462, in which fugitive plugs are inserted into the cooling holes and partially volatilize during the coating process. The volatilization disrupts the coating in the region of the hole, and once the plugs are completely removed the holes are essentially free of coating and the cooling air will be unimpeded.

One disadvantage of the method disclosed in U.S. Pat. No. 4,743,462 is that the plugs must all be placed individually into the cooling holes. For small simple aero-engine parts such as the one illustrated in the disclosure (containing only several rows of cooling holes at the leading edge) this is feasible, however for large turbine components of land-based gas turbines which may contain several hundred cooling holes, it is no longer feasible to individually place plugs into each hole. This is further complicated by the fact that each component may be manufactured with several different types of cooling hole—including conical, straight cylindrical and holes with changing wall angles. Each type of cooling hole would require its own specially designed plug.

An alternative to this method is disclosed in U.S. Pat. No. 5,985,122 and U.S. Pat. No. B1-6,258,226, in which a tool is configured to fit simultaneously into a plurality of cooling holes prior to the application of coating (in this case using electrolytic coating techniques). The technique may be well suited for the protection of trailing edge cooling holes which are all aligned in one or two lines, but it would not be possible to use in thermal spraying coating techniques, particularly with components containing many cooling holes arranged along several rows on the airfoil, due to the "shadow" effect of the many required apertures to block the holes. A similar fixture is disclosed in U.S. Pat. No. 5,565,035.

A further disclosure in which all holes are plugged at once is given in U.S. Pat. No. 5,800,695. A masking agent is placed into the cooling configuration and forced through until it fills the cooling holes from the inside, but only up to the level of the exterior surface of the component. A coating is then applied, in this case electrolytically applied platinum.

Due to the non-conductivity of the plastic maskant cited in the disclosure, no Pt would deposit on the masking agent in the cooling holes.

In addition, only plastic materials are specified as maskant materials, and in U.S. Pat. No. 4,743,462 the mask material is specified to volatilize at a temperature below that of the deposition process. The problem with this is that part requiring a MCrAlY coating and TBC must have the MCrAlY coating "diffusion bonded" by a high temperature heat treatment (about 1000° C.–1150° C. in vacuum) before the TBC can be applied. These specified materials would not be retained for the TBC coating process, and would either have to be re-applied, or the advantage of the masking would be lost. Indeed, in patent U.S. Pat. No. 5,800,695 the example process clearly states that after electrolytic platinum coating, the maskant is removed and then the parts are aluminized, with no mention of protecting the cooling holes from Al deposition.

This problem is addressed in further current art which does not use plugging techniques. U.S. Pat. No. 6,004,620 discloses a technique in which the coating is applied to the component as normal, over the open and unprotected cooling holes. Then a high pressure water jet originating from the inside of the component cleans the cooling holes of unwanted coating build-up. This invention was originally destined for combustors—large conical components for which implementing this technique is feasible. However, it would be nearly impossible to insert a high pressure water jet device into the cooling configuration of a turbine blade. In stator vanes this only would be feasible, if the cooling air distributing insert is first removed.

A similar disclosure is given in US-A1-2001/0001680 and US-A1-2001/0006707. In this case, it is specified that the coating is applied to the component at a special angle with respect to the angle of the cooling holes so as to minimize the amount of coating entering the cooling holes. In addition, the water jet still originates from the inside of the component (from the side with the uncoated surface) but the jet is aligned to be parallel with the axis of the cooling hole in order to more effectively remove the unwanted coating from inside the cooling hole. The water pressures used for the water jets in these applications range from 5 to 50 thousand pounds per square inch (psi) and in general the water does not contain abrasive particles. Another possibility is disclosed in patent U.S. Pat. No. B1-6,210,488 in which a caustic solution is used to dissolve the TBC inside of cooling holes, assisted with ultrasound as an option. However, this disclosure was designed for complete removal of the TBC from a part coming out of service, and is not suitable for removing TBC only from inside the cooling holes. Masking the rest of the TBC over the entire outer surface of the component would not be practical.

U.S. Pat. No. 5,216,808 discloses the use of a pulsed ultraviolet laser to remove the unwanted TBC from within the cooling holes (after coating the component with unprotected cooling holes), since the wavelength of the UV laser is particularly well absorbed by the material used to make TBC's (namely zirconium oxide). However, this method is not effective at removing unwanted MCrAlY in the cooling holes since the absorption of the radiation by the MCrAlY is not nearly as efficient as with the TBC. This invention recognizes the problem of extreme filling of the cooling holes with TBC material, as it includes the use of "machine vision" which locates the holes based on a datum in a CAD (computer aided design) file. A CNC positioning device then is used to properly locate the part relative to the laser, and then cleaning of the cooling holes is performed automatically according to the recorded positions of the cooling holes in the CNC data.

Another approach to the problem is to make the cooling holes larger than originally intended by design, and then coat directly onto the component without protecting the cooling holes. Since the cooling holes are too large to begin with, the coating which enters them will then bring them back within manufacturing tolerances and restore the desired cooling air flow. One version of this is disclosed in U.S. Pat. No. 6,042,879 in which an auxiliary coating is applied to the old coating, including that portion of the old coating adjacent to the cooling holes, and also to the base material of the cooling hole at the portion close to the exterior surface. This auxiliary coating is then diffused into the component with a heat treatment, and then the old and auxiliary coatings, together with the diffusion zone in the cooling hole outer portion are removed by chemical etching. A masking agent may also be used to protect the inner portion of the cooling hole from chemical attack. The disadvantage of this is that it requires a heat treatment at high temperature to create the diffusion zone, and those skilled in the art know that all such high temperature heat treatments degrade the microstructure of the alloy used for most gas turbine components. Further more, as admitted in the disclosure, not all the holes will be uniformly affected, but it is hoped that the overall distribution of cooling air flows will be within originally intended manufacturing tolerances (therefore this introduces uncertainty into the final temperature distribution of the component in the engine, which is highly undesirable).

So far the simplest solutions offered were those involving masking agents to prevent coating in the cooling holes, but these were only valid for electrolytic processes. However, U.S. Pat. No. B1-6,265,022 discloses the use of polymer based masking agents to be used for all types of coating processes in which the component did not have to be pre-heated to a temperature that would destroy the masking material. However, this disclosures specified that the masking material must protrude for a certain distance above the hole exit at the exterior surface of the component. Each disclosure had a different method of providing this: one by using a polymerizing energy source from the interior of the component, which is difficult to realize for many component designs and the other by providing a preform from wax, and then filing this with a polymerizing mask agent which, after hardening, provides the desired protrusions.

SUMMARY OF THE INVENTION

It is the object of the present invention to find a cheaper, easier and faster method of adequately protecting all cooling holes of a gas turbine component from being partially or totally filled beyond a desired limit with a coating substance during the coating process carried out on the component. This invention is particularly suited to prevent the filling beyond desired limits of the cooling holes in gas turbine blades and stator vanes with a coating applied by thermal spray, electrolytic deposition, or other deposition means.

According to the invention a process was found of masking cooling holes of a gas turbine component with an external surface, comprising a cavity and a plurality of cooling holes, before coating the gas turbine component, comprising the steps of (a) applying a mask material to the cooling holes so that the cooling holes are at least partially filled with the mask material in the portion closest to the external surface and substantially up to the level of the external surface, the mask material containing a substance which fluoresces under ultraviolet light and in at least a portion located at the external surface of the component a filler material, (b) at least partially thickening at least a portion of the mask material within the cooling holes, (c) carrying out an inspection using ultraviolet light to locate any unwanted residual mask material on the external surface of the component and removing this unwanted residual mask material by mechanical means, (d) coating the external surface of the component and the masked cooling holes and (e) removing the remaining thickened mask material from the cooling holes.

According to this invention the polymer mask material, when it contained an appropriate mixture of fillers, could be filled into the cooling holes only up to the exterior surface of the component and still adequately protect the cooling holes from being filled with coating material. This made unnecessary the arduous task of providing polymerizing energy from the inside of the component, which is sometimes impossible, and/or providing a wax shape on the exterior of the part, into which the mask material would be filled and hardened, in order to provide a protrusion of mask material beyond the exterior surface of the component prior to the coating operation. Advantageously, the proper selection of mask material and filler material ensured non-sticking of the coating material to the mask. The filler material is selected from particles or fibres of metal, oxide material such as silica, magnesia, calcia, alumina, zirconia, yttria or a mixture there of, which provided adequate wear and thermal resistance in the range of 5 to 95 vol.-% and in a preferred range of 20–90 vol.-%. Metallic fillers, other oxide fillers, organic materials or endothermic fillers said endothermic fillers including carbonate compounds or mixtures thereof are also possible. Particle sizes from 1 µm average diameter to over 500 µm diameter are possible. However the average particle size from 10 µm to 180 µm, with a preferred range of 20 to 80 µm, showed superior improvements to the thermal resistance, mechanical resistance and general handling of the masking material compared to a general size range.

The mask material can be applied to the cooling holes from the external surface which consumed far less of the polymer compare to any of the prior art using such mask materials in which either the entire cooling configuration had to be filled with polymer, or the entire component had to be dipped in polymer. Still one embodiment is to apply the mask material from an internal cavity of the component. The mask material can be applied to all cooling holes of the component or in a case where only a part of the surface of the component has to be coated only selectively to desired cooling holes or rows of cooling holes.

An energy source can be placed from the outside of the component so that the energy impinges directly on said mask material which plugs the cooling holes.

It was found that residual polymer on the outer surface of the component would cause poor bonding quality, hence the need to clean the entire surface mechanically by e.g. grit blasting to ensure high bonding integrity of the coating. Thus, a substance which fluoresces under ultraviolet light was added to the mask material, which allows an inspection to locate any unwanted excess residual masking material. Inspection was performed using ultraviolet lights of the types found in normal Florescent Penetrant Inspection (FPI) booths well known to those skilled in the art. Any excess mask on the surface of the component was removed by mechanical means in preparation for the coating operation.

If necessary, after removing unwanted residual mask material a re-inspection can be carried out using ultraviolet light to locate any further unwanted residual mask material.

In order to facilitate the application and/or hardening of at least a portion of the mask material the component may be heated or cooled before or during processing.

it was also found that filling the cooling holes in successive stages which it is at least partially thickened before the application of the next amount in the cooling hole, and using a gradient of filling materials offered advantages. Only the layers of material at the uppermost portions of the cooling holes required significant volume fractions of solid fillers in the range of 45–90 vol.-% to a depth not less than 1 mm to give them wear resistance against the grit blasting required to clean the entire outer surface of the component prior to the coating operation.

In a further embodiment of the current invention, for the cases where the invention is still not sufficient to completely prevent plugging of the cooling holes with coating material, a water jet could be used to remove any residual coating which is in the cooling holes. This step can be done manually, or by locating the cooling holes using a three dimensional vision system which directs a CNC machine using the same program to drill the cooling holes in the first place.

The mask material can be a UV polymerizing plastic such as polyurethane, a polyurethane oligomer mixture, 2-Hydroxyl Methacrylate, Isobornyl Acrylate, Maleic acid, methyl methacrylate, butyl acrylate copolymer, acrylic acid, T-Butyl Perbenzoate, poly(isobutyl methacrylate), poly(vinyl toluene), polyproplyene or a polypropylene/polyurethane oligomer mixture, the class of polymers vetones or silicones, or any mixture thereof. It can as well be a photopolymerizing resin or a mixture of resins and photo-initiator which polymerize with exposure to ultraviolet light. The mask material may also be a substance that is not at least partially liquid but rather a powder, which means a collection of solid particles.

The thickened mask material containing the filler material may further be heated so as to volatilize or otherwise remove the organic portion of the mask material before the coating is deposited. There may be included in the resin binding agents which are effective in holding together the solid particles of metal or oxide after the organic portion of the mask material is removed so that it can withstand the high temperatures of the diffusion heat treatment necessary for the bonding between base material of the part and the MCrAlY coating, before applying the thermal barrier coating TBC.

The mask material is thickened by an energy source, which may be electromagnetic such as visible, ultraviolet or infra-red light or collimated light such as laser.

The disclosed method of mask the cooling holes according to the present invention can be first applied for the deposition of a bond coating (MCrAlY) and then, subsequently, used for the application of a ceramic coating (TBC) on top of the bond coating (MCrAlY).

In general, the coating could be applied e.g. by at least one of the coating methods of plasma spray, wire arc spray, high velocity oxy-fuel (HVOF), air plasma spray (APS), low pressure plasma spray (LPPS), vacuum plasma spray (VPS), electrolytic or galvanic deposition, Physical Vapour Deposition (PVD), Chemical Vapour Deposition (CVD) or any other suitable methods known in the prior art.

BRIEF DESCRIPTION OF THE DRAWINGS

Preferred embodiments of the invention are illustrated in the accompanying drawings, in which FIG. 4a–d shows the appearance of airfoil cooling holes that were masked before each coating operation, while

The drawings show only the parts important for the invention. Same elements will be numbered in the same way in different drawings.

DETAILED DESCRIPTION OF THE INVENTION

Figure 1:
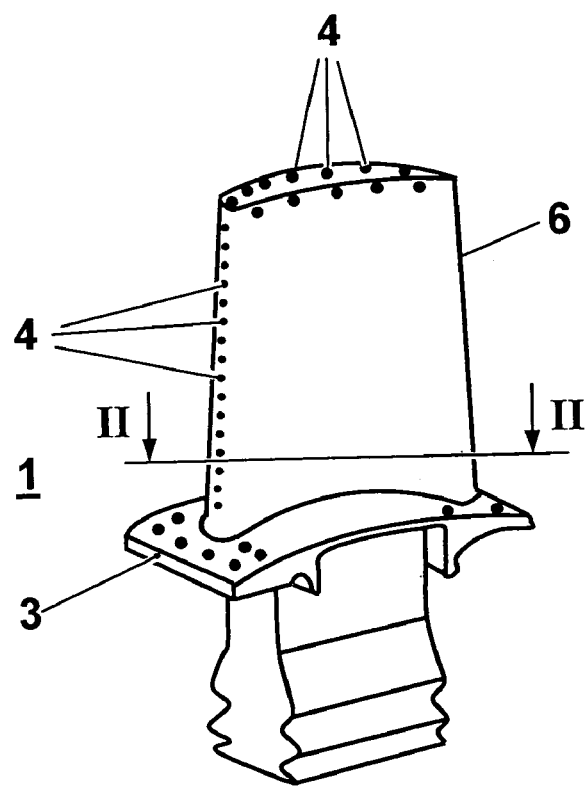
FIG. 1 shows a gas turbine blade with cooling configuration.

FIG. 1 shows a component 1 such as blades or vanes of gas turbine engines comprising a cavity 2, not visible in FIG. 1, and cooling holes 4, which are on the external surface 6 of the component 1 as well as on the platform 3 of the component 1. The present invention relates to a process of masking cooling holes 4 in the component 1 before the deposition of coating material on the external surface 6 of the component 1 will take place.

Figure 2:
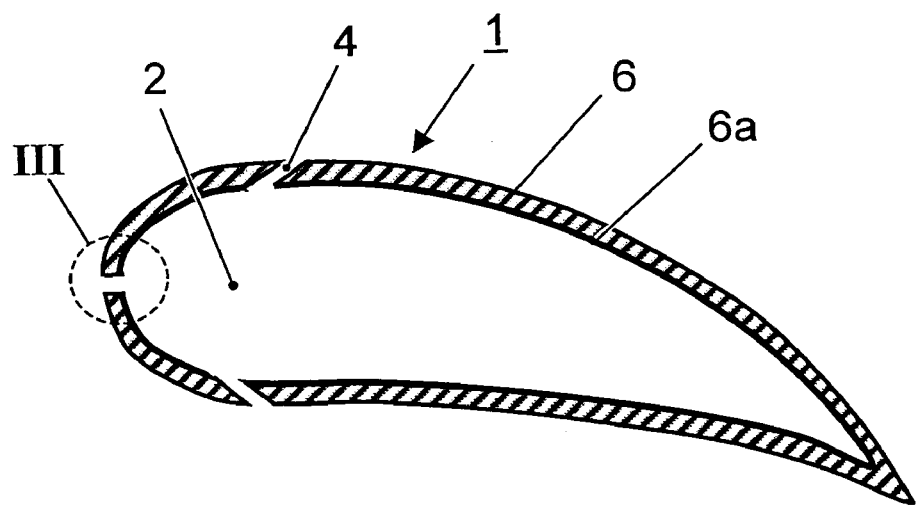
FIG. 2 shows a section by line II—II through the turbine blade shown in FIG. 1, comprising a cavity and a plurality cooling holes.

According to line II—II in the FIG. 1 FIG. 2 shows a section through the component 1. The component 1 comprising a cavity 2 and three cooling holes 4. The number of the cooling holes 4 is given only as an example and may vary on the purpose the component 1 is used for. The component 1 has an external surface 6 and an internal surface 6a.

It is possible to apply the process for the coating of a new component 1 as well as to a component 1 which has to be repaired after use. In that case an already coated component 1 will by any means (chemical stripping with HCl, water jet, high speed machining) be stripped of the coating to reveal the external surface 6 of the component 1. The external surface 6 of the component 1 and surfaces of the cooling holes 4 may be cleaned or otherwise prepared to receive the mask material 5.

The steps of the process of the invention are given in FIGS. 3a to 3g, which show a cooling hole 4 from the component 1 in detail as given as an example in the circle III in the FIG. 2.

Figure 3A:
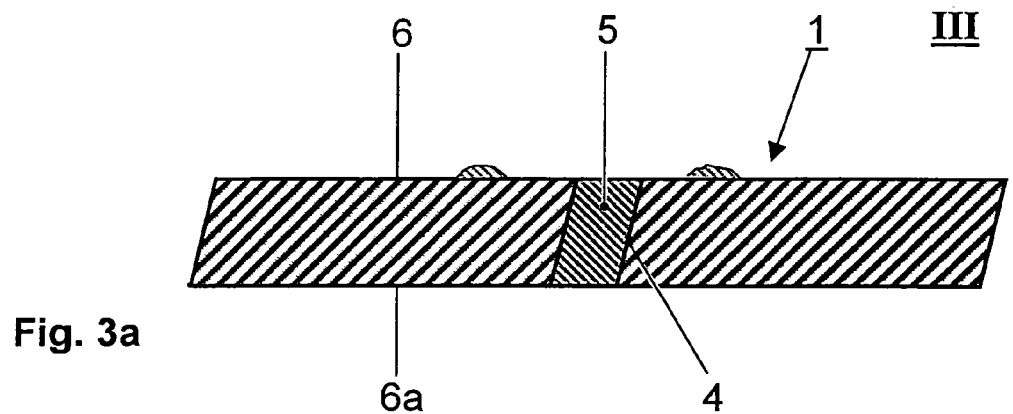
FIG. 3a–g shows the steps of the process of the invention, applying mask material to the cooling holes, thickening the mask material and removing any residual mask material in the cooling, shown as an example at one cooling hole according to the circle III in FIG. 2.

The FIG. 3a shows the first step of the process according to the invention. The cooling holes 4 are masked with the mask material 5. It will be coated with, sprayed with, or immersed in a material which is at least partially liquid, the mask material 5, and which thickens, which means to become more viscous or solid when exposed to an energy source 7. A way it may be done is to inject the mask material 5 into the cooling cavity 2 of the component 1 and force it through the cooling holes 4. Excess mask material 5 may be removed afterwards from the external and the internal surface 6, 6a (which can be the cavity 2 or one side of the platform 3 not to be coated) of the component 1 before the application of an energy source 7. As further explained below still one advantageous embodiment is to apply to mask material 5 from the external surface 6. The mask material 5 can be applied to all cooling holes 4 of the component 1 or in a case where only a part of the surface 6 of the component 1 has to be coated only selectively to desired cooling holes 4 or rows of cooling holes 4.

As mask material 5 different substances may be used:
1. a organic material or
2. a resin of a plastic such as polyurethane, a polyurethane oligomer mixture, 2-Hydroxyl Methacrylate, Isobornyl Acrylate, Maleic acid, methyl methacrylate, butyl acrylate copolymer, acrylic acid, T-Butyl Perbenzoate, poly(isobutyl methacrylate), poly(vinyl toluene), polyproplyene or a polypropylene/polyurethane oligomer mixture, the class of polymers vetones or silicones, or any mixture thereof,
3. a photopolymerizing resin or a mixture of resins and photoinitiator which polymerize with exposure to ultraviolet light,
4. the mask material 5 may also be a substance that is not at least partially liquid but rather a powder, which means a collection of solid particles. Thickening of the powder then refers to the agglomeration and the sticking together to form clumps or a large solid mass of individual powder particles. The powder would have to be sensitive to an energy source 7, which means that the powder particles agglomerate under the influence of the energy source 7.

In addition, fillers were required to impart the mask materials 5 with thermal resistance and impact resistance to the spraying process used to deposit the MCrAlY coating and/or TBC. One of the possible ceramic fillers tried was particles or fibres of metal, oxide material such as silica, magnesia, calcia, alumina, zirconia, yttria or a mixture there of, which provided adequate wear and thermal resistance. Metallic fillers, other oxide fillers or organic materials are also possible.

Figure 3B:
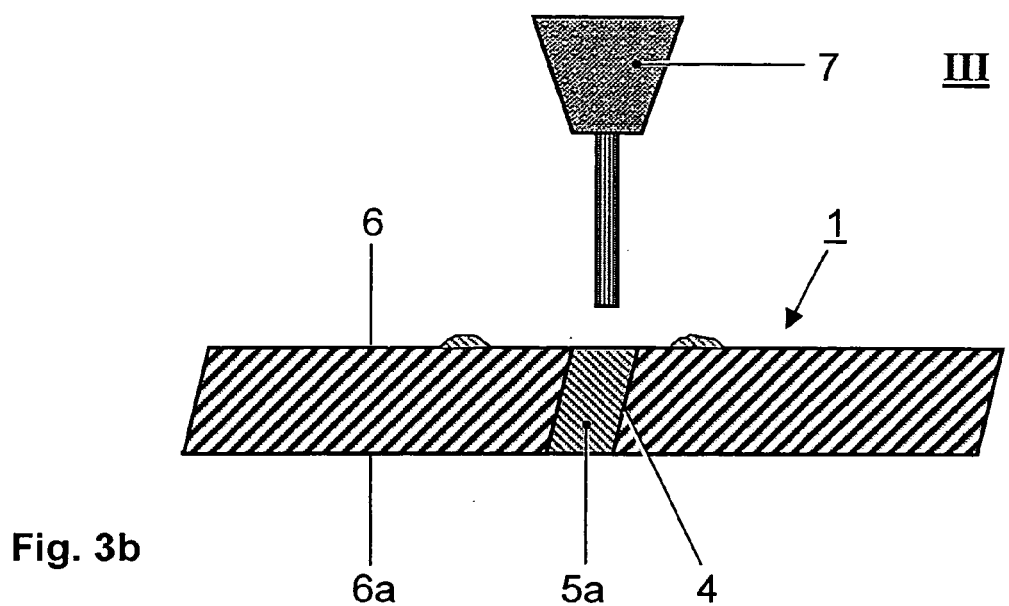

FIG. 3b shows the second step of the process according the invention of at least partially thickening the mask material 5. A desired energy source 7 will be placed from the outside of the component 1 so that the energy impinges directly on said mask material 5 which is in the cooling holes 4. FIG. 3b shows the thickened material 5a as well.

Different energy sources 7 may be used in order to obtain the desirable result:
1. it can be electromagnetic such as visible light, ultraviolet light or infra-red light,
2. it can be a device providing collimated light such as a laser,
3. the energy source 7 can also be a device providing light of a single wavelength or a distribution of wavelengths centered around a desired wavelength with a narrow distribution band,
4. furthermore the energy source 7 may be introduced into the cavity 2 of the component 1 via an optical fiber or
5. the energy source 7 can be sonic vibrations ranging from infrasonic (below 20 Hz) to ultrasonic (above 20,000 Hz) frequencies. Is this case the energy source can be a transducer (i.e. an ultrasonic transducer).

The mask material 5a thickened from the energy source 7 containing the filler material may further be heated so as to volatilize or otherwise remove the organic portion of the thickened mask material 5a before the coating 8 is deposited on external surface 6 of the component 1. There may be included in the resin binding agents which are effective in holding together the solid particles of metal or oxide after the organic portion of the mask material 5a is removed so that it can withstand the high temperatures of the diffusion heat treatment necessary for the bonding between base material of the component 1 and the MCrAlY coating, before applying the thermal barrier coating TBC.

According to this invention the polymer mask material 5, when it contained an appropriate mixture of fillers, could be filled into the cooling holes 4 only up to the exterior surface 6 of the component 1 and still adequately protect the cooling holes 4 from being filled with coating material 8. This made unnecessary the arduous task of providing polymerizing energy from the inside of the component 1, which is sometimes impossible, and/or providing a wax shape on the exterior of the part, into which the mask material 5 would be filled and hardened, in order to provide a protrusion of mask material 5 beyond the exterior surface 6 of the component 1 prior to the coating operation.

Importantly, this invention also made unnecessary the providing of excess polymerizing liquid over the cooling holes 4, for the purpose of providing enough material to produce the protrusion of mask material 5 beyond the external surface 5 of the component 1. Thus, the masking operation has become much more simple, rapid and cheap.

In addition, the application of the polymerizing material from the external surface 6 of the component 1 prevented complications of plugging in the cooling configuration, or restricted flow through a cooling air distribution insert.

Furthermore, the addition of the polymer from the outer surface of the component via syringe or spatula consumed far less of the polymer compare to any of the prior art such as U.S. Pat. No. B1-6,265,022 or U.S. Pat. No. 4,743,462 using such mask materials 5 in which either the entire cooling configuration had to be filled with polymer, or the entire component 1 had to be dipped in polymer.

Figure 3C:
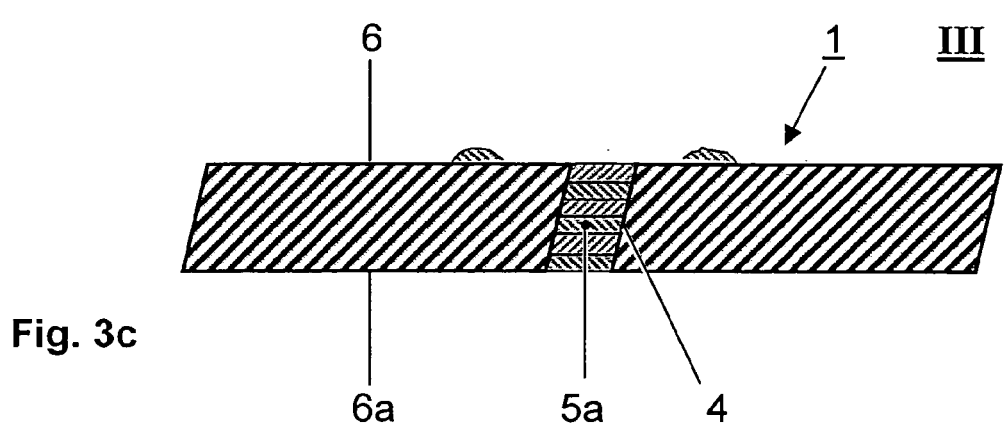

As seen in FIG. 3c it was also found that filling the cooling holes 4 in successive stages, and using a gradient of filling materials offered advantages. For example, polymerization was more rapidly carried out on pure polymer placed in the cooling holes 4 in a first layer. Only the layers of material at the uppermost portions of the cooling holes 4 required significant volume fractions of solid fillers to give them wear resistance against the grit blasting required to clean the entire outer surface of the component prior to the coating operation.

Figure 3D:
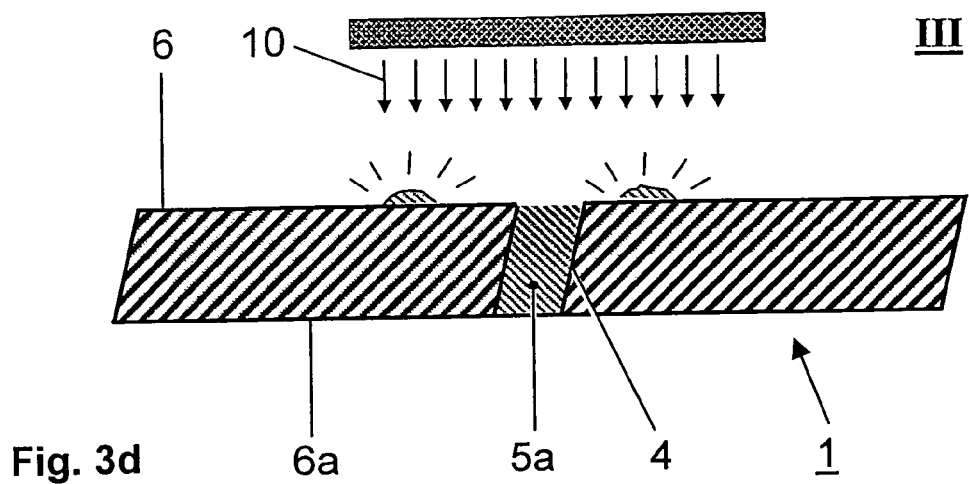

It was found that residual polymer on the outer surface 6 of the component 1 would cause poor bonding quality, hence the need to grit blast the entire surface 6 to ensure high bonding integrity. Thus, a substance which fluoresces under ultraviolet light was added to the mask material, which allows an inspection to locate any unwanted excess residual masking material. As seen in FIG. 3d, the inspection was performed using ultraviolet lights 10 of the types found in normal Florescent Penetrant Inspection (FPI) booths well known to those skilled in the art. Any excess mask on the surface of the component was removed by mechanical means in preparation for the coating operation. If necessary, after removing unwanted residual mask material 5, a re-inspection can be carried out using ultraviolet light 10 to locate any further unwanted residual mask material 5.

In one embodiment of the current invention, an endothermic material is added as filler material to the polymer in order to provide additional protection from the heat transferred during coating. For example, sodium bicarbonate decomposes in a highly endothermic reaction, which absorbs the heat imparted to the mask material 5 during coating.

In general the filler content is in the range of 5 to 95 vol.-% and in a preferred range of 20–90 vol.-%, at least in the upper most portion of the mask material 5 in the cooling hole 4. In one embodiment the mask material 5 at the portion of the cooling hole 4 exit at the external surface 6 of the component 1 contains 45–90 vol.-% of the filler material to a depth not less than 1 mm. In another embodiment, the cooling holes 4 are sufficiently long that they do not require complete filling, but only partial filling in a way that the upper portion closest to the external surface 6 is filled to provide the desired result. A range of filler particle sizes if effective in improving wear resistance and thermal resistance of the masking material. Particle sizes from 1 μm average diameter to over 500 μm diameter are possible. However the average particle size from 10 μm to 180 μm, with a preferred range of 20 to 80 μm showed superior improvements to the thermal resistance, mechanical resistance and general handling of the masking material compared to a general size range.

Figure 3E:
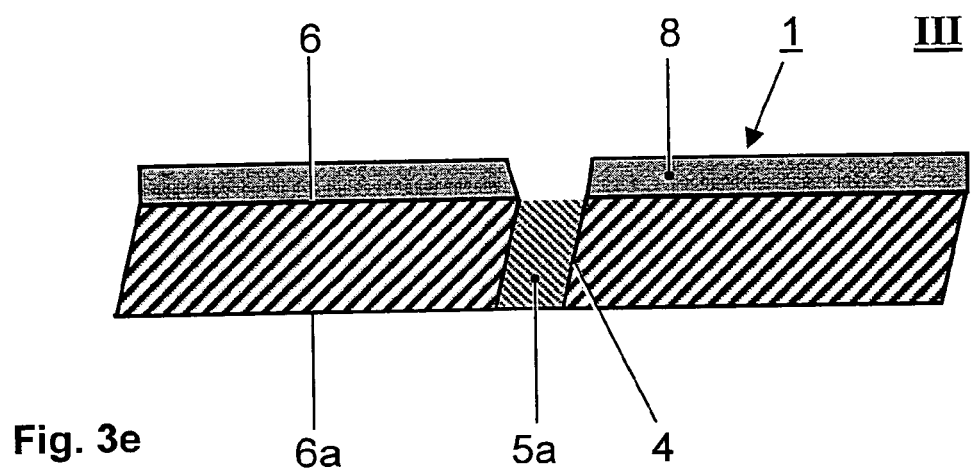

As seen in FIG. 3e the application of the coating 8 on the external surface 6 will take place directly on the masked cooling holes 4 with the means known in the state of the art. As mentioned in "Background of the Invention" this could be MCrAlY and/or TBC applied e.g. by at least one of the coating methods of plasma spray, wire arc spray, high velocity oxy-fuel (HVOF), air plasma spray (APS), low pressure plasma spray (LPPS), vacuum plasma spray (VPS), electrolytic or galvanic deposition, Physical Vapour Deposition (PVD), Chemical Vapour Deposition (CVD) or any other suitable methods known in the prior art. The proper selection of mask material 5 and filler material ensured non-sticking of the coating material to the mask.

Figure 3F:
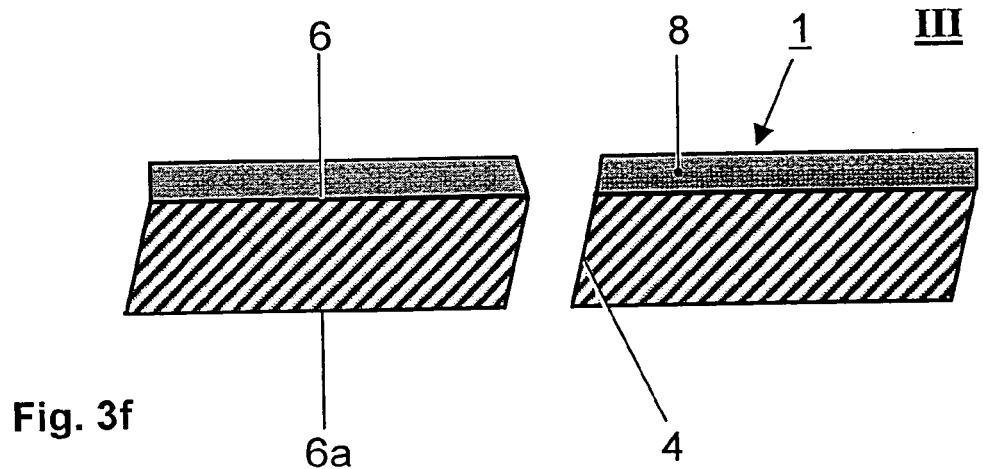

After the coating process(es) are completed, the thickened mask material 5a will be removed to reveal cooling holes 4 essentially free of coating material 8. This is shown in FIG. 3f. For example the removal of the thickening organic mask material 5a can be accomplished by heating the part to 600° C. in a vacuum furnace for 2 hours.

Figure 3G:
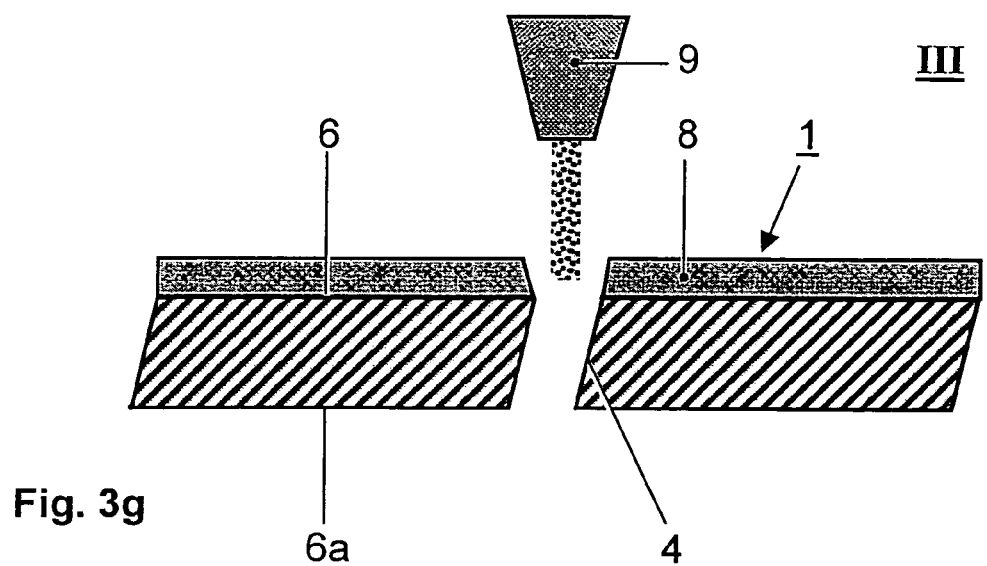
Figure 4A:
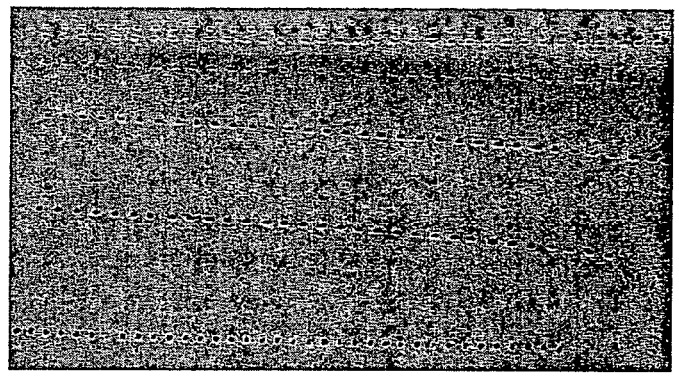
Figure 4B:
Figure 4C:
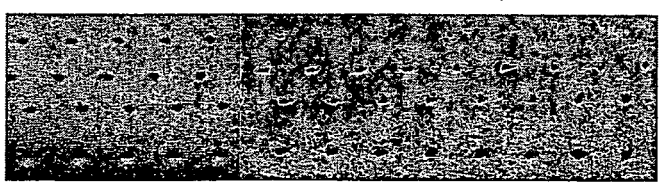
Figure 4D:
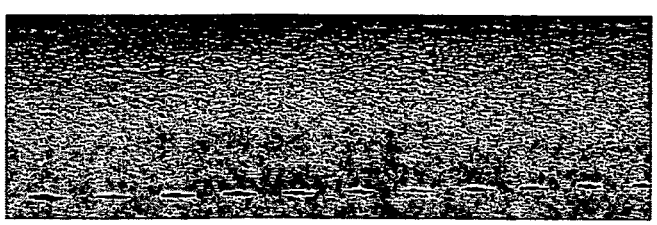
Figure 5A:
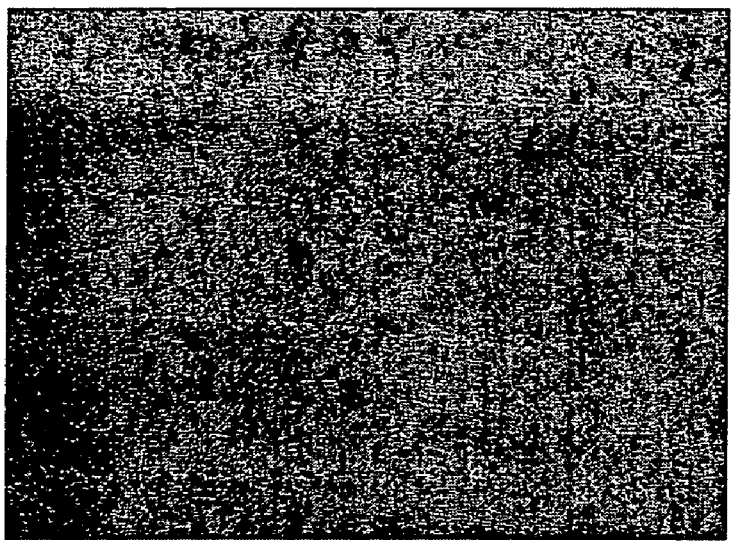
FIG. 5a–d shows the appearance of the cooling holes with no masking applied.
Figure 5B:
Figure 5C:
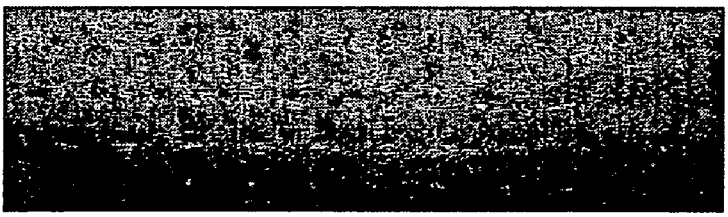
Figure 5D:
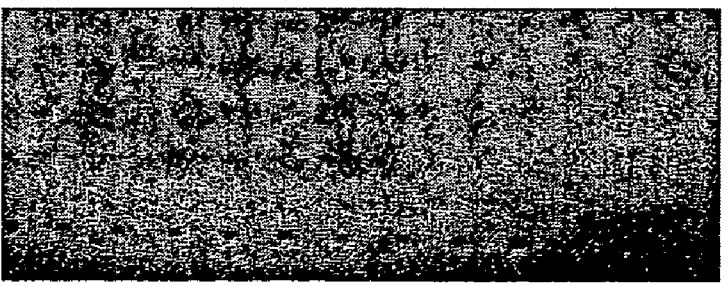

In a further embodiment of the current invention, for the cases where the invention is still not sufficient to completely prevent plugging of the cooling holes 4 with coating material 8, a water jet 9 (as shown in FIG. 3g) could be used to remove any residual coating 8 which is in the cooling holes 4. This step can be done manually, or by locating the cooling holes 4 using a three dimensional vision system which directs a CNC machine using the same program to drill the cooling holes 4 in the first place.

The component 1 may be heated or cooled before or during processing to facilitate the application and/or hardening of at least a portion of the mask material 5.

EXAMPLE OF THE INVENTION

Several first stage vanes from a heavy-duty gas turbine which had been in operation for approximately 25,000 hours were stripped of the old coating using conventional acid etching means, followed by grit blasting for final preparation. Each vane contained approximately 250 cooling holes. Several different mask materials were applied on a trial basis, including a urethane oligomer/(Meth)Acrylate monomer blend, and blends of 2-Hydroxyl Methacrylate, Isobornyl Acrylate, Maleic acid, methyl methacrylate, butyl acrylate copolymer, acrylic acid, T-Butyl Perbenzoate, including photoiniator. In addition, a chemical agent which floresces under exposure to ultraviolet light was added to the mask material. This had the significant advantage of allowing easy inspection for excess mask material on the surface of the component after cleaning by grit blasting. In all cases, the mask material was applied with a spatula into the small numerous cooling holes in the airfoil, and with a syringe into the large cooling holes in the platform. A range of filler contents was used, up to 60% aluminum oxide powder. The average particle size of the aluminum ranged from 10 μm to 180 μm. Particle sizes within this range or in a preferred range of 20 to 80 μm showed superior improvements to the thermal resistance, mechanical resistance and general handling of the masking material compared to a general size range of 1 to 500 μm. After masking application, the polymer was hardened using a 365 nm UV light lamp with an intensity of 150 mW/cm$^2$, with a cure time of approximately 50 seconds. It was helpful to orient the light in a direction parallel to the direction of the cooling holes to ensure optimal absorption and hardening. Excess material on the surface of the vanes was removed after hardening with light grit blasting. Inspection was performed using ultraviolet lights of the types found in normal Florescent Penetrant Inspection (FPI) booths well known to those skilled in the art. Excess mask on the surface of the vanes was located by the florescence of the chemical agent, and removed in preparation for coating. The vanes were prepared for HVOF by coarse grit blasting, heating to 100–200° C., and coating of approximately 200–400 μm thickness of a standard MCrAlY coating. After coating the excess mask material remaining in the cooling holes is removed by heating the components to 300–650° C. to burn off the remaining. If a Thermal Barrier Coating (TBC) needed to be applied, the masking agent can again be applied in the same way, excess on the component outer surface removed with light grit blasting, and TBC applied as normal. In this case, a standard yttria-stabilized zirconia TBC was applied using air plasma spray to thicknesses ranging from 300–1000 μm, depending on the location on the component. As a control, the same components were coated in the same way but without any masking application.

FIG. 5a–d shows the appearance of airfoil cooling holes that were masked before each coating operation, while FIG. 6a–d shows the appearance of the cooling holes with no masking applied. Airflow data was taken from the cooling holes row by row, in the state with original coating, and then with new coating. The holes with masking averaged within +/−10% of the original airflow values, while the holes without masking averaged 80–100% underflow, where 100% underflow represents complete blockage of the holes.

NUMBERING 5 component, e.g. blades or vanes for gas turbines
2 cavity
3 platform
4 cooling hole
5 mask material
5a thickened mask material
6 external surface
6a internal surface
7 energy source
8 coating, coating material
9 water jet
10 ultraviolet light

The invention claimed is:

1. A method of masking cooling holes of a gas turbine component, the gas turbine component comprising an external surface, a cavity and a plurality of cooling holes, the method comprising the steps of
   (a) applying a photopolymerizable mask material substantially only to the cooling holes so that the cooling holes are at least partially filled with the mask material in the portion closest to the external surface up to the level of the external surface, the mask material containing a substance which fluoresces under ultraviolet light and, in at least a portion located at the external surface of the component, a filler material,
   (b) at least partially thickening at least a portion of the mask material within the cooling holes by impinging electromagnetic energy onto the mask material from outside the component,
   (c) carrying out an inspection using ultraviolet light to locate any unwanted 1residual mask material on the external surface of the component and removing this unwanted residual mask material from the external surface by mechanical means,
   (d) coating the external surface of the component and the masked cooling holes and
   (e) removing the remaining thickened mask material from the cooling holes,
      wherein (a)–(b) comprises applying the mask material in a stepwise fashion including at least partially thickening the mask material before applying a next amount of the mask material, and wherein the amount of filler contained in the mask material varies, with the mask material closest to the external surface containing a greater amount of filler.

2. The method according to claim 1, wherein the mask material is applied to the cooling holes from the external surface of the component.

3. The method according to claim 1, wherein the mask material is applied to the cooling holes from an internal cavity of the component.

4. The method according to claim 1, comprising the step of applying the mask material only selectively to desired cooling holes or rows of cooling holes of the component, where a coating on the external surface is required.

5. The method according to claim 1, wherein after applying the mask material and before carrying out an inspection using ultraviolet light the external surface is cleaned by mechanical means to remove residual mask material.

6. The method according to claim 1, wherein after removing unwanted residual mask material a re-inspection is carried out using ultraviolet light to locate any further unwanted residual mask material.

7. The method according to claim 1, wherein the component is heated or cooled before or during the method to facilitate the application and/or thickening of at least a portion of the mask material.

8. The method of claim 1, wherein the mask material at the portion of the cooling holes exit at the external surface of the component contains 45–90 vol.-% filler material, to a depth not less than 1 mm.

9. The method according to claim 1, wherein the fillers added to the mask material include particles or fibres of metal, silica, magnesia, calcia, alumina, zirconia, yttria or a mixture thereof or organic materials.

10. The method according to claim 9, wherein endothermic fillers are added to the mask material, said endothermic fillers including carbonate compounds or mixtures thereof.

11. The method of claim 9, wherein the filler content is in the range of 5–95 vol.-%.

12. The method of claim 11, wherein the filler content is in the range of 20–90 vol.-%.

13. The method according to claim 1, wherein the filler particle diameter size is on average, or contains mixtures with average diameters, ranging from 1 μm to 500 μm.

14. The method according to claim 13, wherein the filler particle diameter size is on average, or contains mixtures with average diameters, ranging from 10 μm to 180 μm.

15. The method according to claim 14, wherein the filler particle diameter size is on average, or contains mixtures with average diameters, ranging from 20 μm to 80 μm.

16. The method according to claim 1, wherein removal of any residual coating material in the cooling holes is completed by water jet machining.

17. The method according to claim 16, wherein removal of any residual coating material in the cooling holes is done by locating the cooling holes using a vision system which directs a CNC machine.

18. The method according to claim 1, wherein the mask material is a photopolymerizing resin or a mixture of resins and photoinitiator which polymerize with exposure to ultraviolet light.

19. The method according to claim 1, wherein the mask material comprises polyurethane, a polyurethane oligomer mixture, 2-Hydroxyl Methacrylate, Isobornyl Acrylate, Maleic acid, methyl methacrylate, butyl acrylate copolymer, acrylic acid, T-Butyl Perbenzoate, poly(isobutyl methacrylate), poly(vinyl toluene), polyproplyene or a polypropylene/polyurethane oligomer mixture, the class of polymers vetones or silicones, or any mixture thereof.

20. The method according to of claim 19, wherein thickened mask material containing the filler material is heated or processed so as to volatilize or otherwise remove the organic portion of the mask material before the coating is deposited on the external surface the component.

21. The method according to of claim 19, wherein there are included in the mask material binding agents which are effective in holding together the solid particles or fibres of the filler material after the organic portion of the mask material is removed.

22. The method according to claim 1, wherein the mask material is thickened by an energy source comprising visible, ultraviolet or infra-red light or collimated light.

23. The method according to claim 1, wherein the method of masking the cooling holes is first applied for the deposition of a bond coating and then, subsequently, for the application of a ceramic coating on top of the bond coating.

24. The method according to claim 1, wherein at least one of the coating methods of plasma spray, wire arc spray, high velocity oxy-fuel (HVOF), air plasma spray (APS), low pressure plasma spray (LPPS), vacuum plasma spray (VPS), electrolytic or galvanic deposition, Physical Vapour Deposition (PVD), or Chemical Vapour Deposition (CVD) is used to apply the coating.

* * * * *